(12) United States Patent
Lee et al.

(10) Patent No.: US 9,923,582 B2
(45) Date of Patent: Mar. 20, 2018

(54) HIGH-FREQUENCY SIGNAL PREDISTORTION DEVICE AND NONLINEAR DISTORTION CORRECTING DEVICE FOR POWER AMPLIFIER

(71) Applicants: SAMSUNG ELECTRO-MECHANICS CO., LTD., Suwon-si (KR); Korea Advanced Institute of Science and Technology, Daejeon (KR)

(72) Inventors: Yong Hoon Lee, Daejeon (KR); Sang Il Lee, Daejeon (KR); Min Hyun Kim, Daejeon (KR); Young Wook Sirl, Daejeon (KR); Eui Rim Jeong, Daejeon (KR); Soon Il Hong, Daejeon (KR); Jong Ok Ha, Suwon-si (KR); Seong Jin Kim, Daejeon (KR)

(73) Assignees: Samsung Electro-Mechanics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/264,717

(22) Filed: Sep. 14, 2016

(65) Prior Publication Data

US 2017/0279470 A1  Sep. 28, 2017

(30) Foreign Application Priority Data

Mar. 23, 2016  (KR) .......................... 10-2016-0034426

(51) Int. Cl.
*H04B 7/04* (2017.01)
*H04B 1/04* (2006.01)

(52) U.S. Cl.
CPC ....... *H04B 1/04* (2013.01); *H04B 2001/0425* (2013.01)

(58) Field of Classification Search
CPC .......................... H04B 1/04; H04B 2001/0425
See application file for complete search history.

(56) References Cited

U.S. PATENT DOCUMENTS

2002/0034260 A1* 3/2002 Kim ...................... H03F 1/3247
                                                                 375/296
2002/0097811 A1* 7/2002 Kubo ........................ H04L 5/06
                                                                 375/296

(Continued)

FOREIGN PATENT DOCUMENTS

KR  10-2014-0118130 A  10/2014
KR  10-2014-0120144 A  10/2014

*Primary Examiner* — Dac Ha
(74) *Attorney, Agent, or Firm* — NSIP Law

(57) ABSTRACT

A high-frequency signal predistortion device includes a high-frequency signal estimator, a predistortion estimator, and a predistorter. The high-frequency signal estimator is configured to determine non-linear distortion characteristics of high-frequency signals transmitted by antennas. The predistortion estimator is coupled to the high-frequency signal estimator. The predistortion estimator is configured to determine a predistortion coefficient based on the non-linear distortion characteristics. The predistorter is coupled to the predistortion estimator. The predistorter is configured to distort a base signal of the high-frequency signals based on the predistortion coefficient.

8 Claims, 5 Drawing Sheets

(56) References Cited

U.S. PATENT DOCUMENTS

| | | | | |
|---|---|---|---|---|
| 2006/0133535 A1* | 6/2006 | Jung | ............... | H01Q 3/267 |
| | | | | 375/296 |
| 2006/0190245 A1* | 8/2006 | Iser | ............... | G10L 21/038 |
| | | | | 704/219 |
| 2008/0143562 A1* | 6/2008 | Huang | ............ | H04L 27/364 |
| | | | | 341/118 |
| 2013/0052964 A1* | 2/2013 | Husted | ............ | H04B 17/11 |
| | | | | 455/73 |
| 2013/0163696 A1* | 6/2013 | Son | ............... | H03F 1/3241 |
| | | | | 375/297 |
| 2014/0016725 A1* | 1/2014 | Peroulas | ......... | H03F 1/3247 |
| | | | | 375/297 |
| 2014/0191798 A1* | 7/2014 | Lozhkin | .......... | H03F 1/3258 |
| | | | | 330/149 |
| 2014/0292579 A1* | 10/2014 | Oh | ................ | H01Q 3/38 |
| | | | | 342/372 |
| 2015/0103952 A1* | 4/2015 | Wang | ............ | H04L 27/368 |
| | | | | 375/297 |
| 2015/0194989 A1* | 7/2015 | Mkadem | ........ | H03F 1/3247 |
| | | | | 375/297 |
| 2016/0119004 A1* | 4/2016 | Rollins | .......... | H04L 27/368 |
| | | | | 375/296 |

\* cited by examiner

US 9,923,582 B2

HIGH-FREQUENCY SIGNAL PREDISTORTION DEVICE AND NONLINEAR DISTORTION CORRECTING DEVICE FOR POWER AMPLIFIER

CROSS-REFERENCE TO RELATED APPLICATION(S)

This application claims the benefit under 35 USC 119(a) of Korean Patent Application No. 10-2016-0034426 filed on Mar. 23, 2016 in the Korean Intellectual Property Office, the entire disclosure of which is incorporated herein by reference for all purposes.

BACKGROUND

1. Field

The present disclosure relates to a high-frequency signal predistortion device and a nonlinear distortion correcting device for power amplifier.

2. Description of Related Art

In a communications system, pre-distortion is a technique used to correct non-linearity of a high-frequency signal or a power amplifier. However, pre-distortion is limited to being implemented with respect to a plurality of high-frequency signals or a plurality of power amplifiers.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a high-frequency signal predistortion device includes a high-frequency signal estimator, a predistortion estimator, and a predistorter. The high-frequency signal estimator is configured to determine non-linear distortion characteristics of high-frequency signals transmitted by antennas. The predistortion estimator is coupled to the high-frequency signal estimator. The predistortion estimator is configured to determine a predistortion coefficient based on the non-linear distortion characteristics. The predistorter is coupled to the predistortion estimator. The predistorter is configured to distort a base signal of the high-frequency signals based on the predistortion coefficient.

The high-frequency signal predistortion device may further include power amplifiers configured to amplify and output the high-frequency signals. The high-frequency signal estimator may determine non-linear distortion characteristics of the power amplifiers.

The high-frequency signal predistortion device may further include a high-frequency chain coupled between the predistorter and the power amplifiers. The high-frequency chain performs digital-to-analog conversion operations and frequency modulation operations on the base signal. The feedback detector converting signals output by the power amplifiers into a baseband signal, performing analog-to-digital conversion operations on the baseband signal, and transmitting the baseband signal to the high-frequency signal estimator.

The high-frequency signal predistortion device may further include a beamformer that is configured to shift a phase of the base signal predistorted by the predistorter based on a beamforming vector.

The predistortion coefficient may be a value for significantly reducing a difference between a value obtained by multiplying power of the base signal by the beamforming vector, and a value based on the non-linear distortion characteristics.

The high-frequency signal estimator may include training sequence blocks determining the non-linear distortion characteristics using a least squares method. The training sequence blocks may sequentially receive the high-frequency signals through a single input path to be applied to the training sequence blocks in a time sharing method, and may determine a cost function of a least squares method with respect to each of the training sequence blocks. The training sequence blocks may determine a least-squares determined coefficient significantly reducing the cost function of the least squares method.

The predistortion estimator may determine the predistortion coefficient on the basis of a gradient vector based on the non-linear distortion characteristics and a correlation matrix based on power of the base signal.

The predistortion estimator may update a value obtained by subtracting a value based on multiplication of the gradient vector and the correlation matrix, from an N predistortion coefficient used for predistortion in an N step, by predistortion in an N+1 step.

In another general aspect, a nonlinear distortion correcting device for power amplifier includes a predistortion unit and a feedback signal processing unit. The predistortion unit is configured to distort a base signal based on an N predistortion coefficient, convert the base signal into high-frequency signals, and transmit the high-frequency signals to power amplifiers, respectively. The feedback signal processing unit determines non-linear distortion characteristics of the power amplifiers to determine an N+1 predistortion coefficient, and updating the N predistortion coefficient to the N+1 predistortion coefficient.

The power amplifiers may be provided as a first power amplifier, a second power amplifier, a third power amplifier, and a fourth power amplifier. The predistortion unit may includes a multiple-input multiple-output (MIMO) precoder generating the base signal using a MIMO scheme, a predistorter predistorting the base signal based on an N predistortion coefficient, a first beamformer shifting a phase of a signal predistorted by the predistorter based on a beamforming vector to transmit the signal to the first power amplifier and the second power amplifier, and a second beamformer shifting a phase of a signal predistorted by the predistorter based on a beamforming vector to transmit the signal to the third power amplifier and the fourth power amplifier.

In another general aspect, a high-frequency signal predistortion device includes a predistortion unit, an amplifier, a feedback signal processing unit. The predistortion unit is configured to acquire an input signal and output a high frequency signal. The amplifier is configured to receive and amplify the high frequency signal. The feedback signal processing unit is configured to receive the amplified signal and feed it back to the predistortion unit. The feedback signal processing unit includes a feedback detector for converting the amplified signal into a baseband signal and transmitting the baseband signal to a high-frequency signal estimator for determining phase and gain characteristics of the baseband signal, and a predistortion estimator coupled between the high-frequency signal estimator and the predistortion unit. The predistortion estimator determines a predistortion coefficient based on the phase and gain characteristics.

The predistortion unit may include a predistorter, a high-frequency chain, and a beamformer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
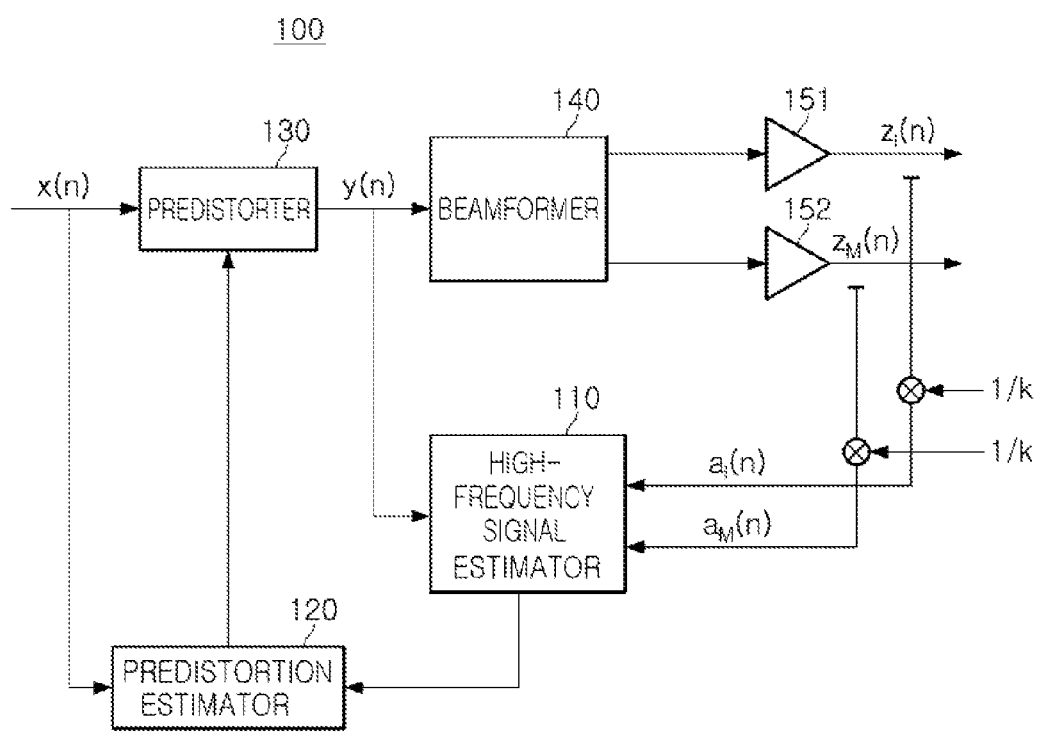
FIG. 1 is a view illustrating an example of a high-frequency signal predistortion device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view illustrating an example of a high-frequency signal predistortion device. Predistortion is used to improve the linearity of amplifiers. Linearity in amplifiers are desired in telecommunications to accurately reproduce the signal present at their input. A non-linear amplifier has a non-linear input to output relationship that causes the output signal to spread to other frequencies causing interference.

A high-frequency signal predistortion device 100, as depicted in FIG. 1, inversely models an amplifier's gain and phase characteristics to reduce the amplifier's distortion. The high-frequency signal predistortion device 100 includes a high-frequency signal estimator 110, a predistortion estimator 120, and a predistorter 130. In addition, according to the design, the high-frequency signal predistortion device 100 may further include a beamformer 140, a first power amplifier 151, and a second power amplifier 152.

In FIG. 1, x(n) is the power of a base signal, y(n) is a predistorted signal, $Z_1(n)$ and $Z_M(n)$ are the power of a plurality of high-frequency signals, $a_1(n)$ and $a_M(n)$ are power obtained by dividing gains K of the first amplifier 151 and the second power amplifier 152 by $Z_1(n)$ and $Z_M(n)$.

The high-frequency signal estimator 110 determines non-linear distortion characteristics of a plurality of high-frequency signals transmitted by different antennas.

For example, the non-linear distortion characteristics may be determined according to Equation 1. Here, $w_j=[w_{1,j}, w_{2,j}, \ldots, w_{L,j}]$ is the non-linear distortion characteristics.

$$a_j(n) = \sum_{k=1}^{L} w_{k,j}|g_j y(n)|^{a(k-1)} g_j y(n) = g_j w_j^T G_j y(n). \quad \text{[Equation 1]}$$

In addition, $G_j=\text{diag}([1,|g_j|^2, \ldots, |g_j|^{2(L-1)}])$ is a beamforming vector, and may be a set form of beamforming coefficients. $y(n)=[y(n),y(n)|y(n)|^2, \ldots, y(n)|y(n)|^{2(L-1)}]^T$ is a matrix of a predistorted signal. In addition, 2(L−1) is a maximum polynomial expression degree of a power amplifier. In other words, Equation 1 is a polynomial expression model.

For example, the high-frequency signal estimator 110 may use a least squares method and may use a least mean square (LMS)-Newton algorithm, which is a modified LMS algorithm for a fast convergence rate.

In addition, the high-frequency signal estimator 110 includes a plurality of training sequence blocks determining the non-linear distortion characteristics using a least squares method, and sequentially receives the plurality of high-frequency signals through a single input path to be applied to the plurality of training sequence blocks in a time sharing method. The number of the plurality of training sequence blocks may be the same as the number of the plurality of high-frequency signals. Each of the plurality of training sequence blocks may include a plurality of training symbols in the form of $[y(1), y(2), \ldots, y(n)]$. The plurality of training sequence blocks are sequentially used and may determine one high-frequency signal for one cycle.

In addition, the high-frequency signal estimator 110 may determine a cost function of the least squares method with respect to each of the plurality of training sequence blocks according to Equation 2.

$$\varepsilon_j = \sum_{n=1}^{N} |a_j(n) - g_j w_j^T G_j y(n)|^2 \qquad \text{[Equation 2]}$$

Here, the high-frequency signal estimator 110 may determine a least-squares determined coefficient significantly reducing $\epsilon_j$ according to Equation 3.

$$\hat{w}_j = \frac{1}{g_j} G_j^{-1} (Y^H Y)^{-2} Y^H a_j. \qquad \text{[Equation 3]}$$

Here, $Y=[y(1), y(2), \ldots, y(n)]^T$, and $a_j=[a_j(1), a_j(2), \ldots, a_j(n)]^T$.

The predistortion estimator 120 may determine a predistortion coefficient based on non-linear distortion characteristics. Here, the predistortion coefficient may be a value significantly reducing a difference between a value obtained by multiplying power of a base signal by a beamforming vector, and a value based on the non-linear distortion characteristics.

In other words, the predistortion estimator 120 may determine the predistortion coefficient to significantly reduce an expected value of a sum of square errors according to Equation 4.

$$E\left[\sum_{j=1}^{M} |e_j(n)|^2\right] \triangleq E\left[\sum_{j=1}^{M} |g_j x(n) - a_j(n)|^2\right] \qquad \text{[Equation 4]}$$

$$= E\left[\sum_{j=1}^{M} |g_j|^2 |x(n) - w_j^T G_j y(n)|^2\right]$$

$$\triangleq E\left[\sum_{j=1}^{M} |g_j|^2 |\bar{e}_j(n)|^2\right].$$

Here, $\bar{e}_j(n)=x(n)-w_j^T G_j y(n)$ is an expected value of a square error. The expected value of a square error may be significantly reduced according to an LMS algorithm, or the like.

The predistortion estimator 120 may determine a predistortion characteristic according to Equation 5.

$$y(n) = \sum_{k=1}^{Q} h_k^* |x(n)|^{2(k-1)} x(n) = h^N x(n). \qquad \text{[Equation 5]}$$

Here, $h=[h_1, h_2, \ldots, h_Q]$ is predistortion characteristics, $x(n)=[x(n), x(n)|x(n)|^2, \ldots, x(n)|x(n)|^{2(Q-1)}]^T$, and $2(Q-1)$ is a maximum polynomial expression degree of a predistorter.

Here, in a case in which correlation of $x(n)$ is high, a convergence rate of the LMS algorithm may be slow. Thus, the predistortion estimator 120 may calculate a predistortion coefficient according to Equation 6 using the LMS-Newton algorithm.

$$h(n+1) = h(n) - \mu \hat{R}^{-1}(n) \hat{g}_h(n) \qquad \text{[Equation 6]}$$

Here, $h(n+1)$ is an N+1 predistortion coefficient, $h(n)$ is an N predistortion coefficient, $\mu$ is a step size, and $\hat{R}(n)$ is a correlation matrix. $\hat{g}h(n)$ is a gradient vector, and may be expressed according to Equation 7.

$$g_k(n) = \frac{\partial}{\partial h^*} E\left[\sum_{j=1}^{M} |e_j(n)|^2\right] \qquad \text{[Equation 7]}$$

In other words, the predistortion estimator 120 may determine the predistortion coefficient on the basis of the gradient vector based on the non-linear distortion characteristics and the correlation matrix based on power of the base signal.

Complexity of an inverse operation of the correlation matrix may be high. Thus, the predistortion estimator 120 may calculate an inverse of the correlation matrix according to Equation 8 to which a recursive method having low complexity is applied.

$$\hat{R}^{-1}(n) = \qquad \text{[Equation 8]}$$

$$\frac{1}{1-\alpha}\left[\hat{R}^{-1}(n-1) - \frac{\hat{R}^{-1}(n-1)x(n)x^T(n)\hat{R}^{-1}(n-1)}{\frac{1-\alpha}{\alpha} + x^T(n)\hat{R}^{-1}(n-1)x(n)}\right].$$

Here, $0 < \alpha \leq 0.1$.

The predistortion estimator 120 may determine the gradient vector using the least squares method according to Equation 9.

$$\hat{g}_h(n) = \sum_{j=1}^{M} |g_j|^2 \frac{\partial |\bar{e}_j(n)|^2}{\partial h^*} \qquad \text{[Equation 9]}$$

$$= \sum_{j=1}^{M} |g_j|^2 \left(\frac{\partial |\bar{e}_j(n)|^2}{\partial h^*} \cdot \bar{e}_j^*(n) + \bar{e}_j(n) \cdot \frac{\partial \bar{e}_j^*(n)}{\partial h^*}\right)$$

$$= \sum_{j=1}^{M} |g_j|^2 x(n) \begin{bmatrix} -(w_j^T G_j v_1(n)) \cdot \bar{e}_j^*(n) - \\ \bar{e}_j(n) \cdot (w_j^H G_j v_2(n)) \end{bmatrix}$$

Here, $v_1(n)=[1,2|y(n)|^2,\ldots,L|y(n)|^{2(L-1)}]^T$, and $v_2(n)=[0,(y^*(n))^2,\ldots,(L-1)(y^*(n))^2|y(n)|^{2(L-2)}]^T$.

The predistortion estimator 120 may obtain Equation 10 by substituting Equation 6 with Equation 9.

$$h(n+1) = h(n) + \mu \hat{R}^{-1}(n) \sum_{j=1}^{M} |g_j|^2 x(n)[(w_j^T G_j v_1(n)) \cdot \overline{e}_j^*(n) + \overline{e}_j(n) \cdot (w_j^H G_j v_2(n))] \quad \text{[Equation 10]}$$

Here, $\hat{R}^{-1}(n)$ is a value obtained from Equation 8.

In a hybrid multiple-input multiple-output (MIMO) system, $g_j$ may have a complex value with a level of 1 by a phased array beamformer. Thus, $|g_j|^2=1$, and $G_j$, may be an identity matrix. Thus, Equation 10 may be expressed as Equation 11.

$$h(n+1) = h(n) - \mu \hat{R}^{-1}(n) \sum_{j=1}^{M} x(n) d_j(n) \quad \text{[Equation 11]}$$

Here, $|d_j(n)=(w_j^T v_1(n)) \cdot \overline{e}_j(n) + \overline{e}_j(n) \cdot (w_j^H v_2(n))$. The predistortion coefficient may be updated to correspond to a beamforming coefficient changed according to the time through Equation 11.

The predistorter 130 may pre-distort a base signal of a plurality of high-frequency signals based on the predistortion coefficient. Here, the base signal may be a digital signal or a baseband analog signal which is a signal before the plurality of high-frequency signals are converted.

For example, when the predistorter 130 receives a base signal, which is multiple access modulated, the predistorter may bypass the base signal. In addition, when the predistorter receives a base signal thereafter, the predistorter may pre-distort the base signal using the predistortion coefficient obtained when the base signal was bypassed.

Thus, a single predistorter 130 of the high-frequency signal predistortion device 100 may perform predistortion with respect to a plurality of high-frequency signals or a plurality of power amplifiers, which reduces cost of a communications system. In addition, improving pre-distortion accuracy and linearity of the high-frequency signal reduces power consumption of the power amplifier. Since the power consumption of the power amplifier typically constitutes a large proportion of total power consumption of the communications system, the total power consumption of the communications system may be reduced.

The beamformer 140 may shift a phase of a signal by applying a time delay for beamforming to the signal pre-distorted by the predistorter 130 based on the beamforming vector.

The beamforming vector may be changed over time. Non-linear distortion characteristics of a high-frequency signal changes responsive to changes in the beamforming vector. Thus, a predistortion coefficient determined in the predistortion estimator 120 may be updated when the beamforming vector is changed.

For example, the beamformer 140 may apply the time delay for beamforming to a signal according to a hybrid multiple-input multiple-output (MIMO) scheme. In a hybrid MIMO scheme according to the related art, a predistorter is limited to being implemented for the following reasons: first, as the typical predistorter cannot be disposed between a beamformer and a power amplifier, such a predistorter is limited to being used with a power amplifier on a one-to-one basis; second, as the number of predistorters to be implemented in a baseband is limited to the number of high-frequency chains, one predistorter may end up supporting a number of power amplifiers; and third, as input of a power amplifier is determined by a linear combination of a plurality of data streams, the input of a power amplifier may be changed according to a beamforming coefficient.

One predistorter 130 included in the high-frequency signal predistortion device 100 may perform predistortion with respect to a plurality of power amplifiers. In addition, the high-frequency signal predistortion device 100 may correspond to a change in a beamforming coefficient. Thus, the high-frequency signal predistortion device 100 may be applied to the hybrid MIMO scheme.

The first power amplifier 151 and the second power amplifier 152 output a plurality of high-frequency signals, respectively, by amplifying a signal. The first power amplifier 151 and the second power amplifier 152 amplify the plurality of high-frequency signals, output by the beamformer 140, before antenna transmission occurs. The gain of the first power amplifier 151 and the second power amplifier 152 result in nonlinear distortion of the input signal during the amplification process. Thus, the plurality of high-frequency signals, output by the beamformer 140, will have non-linear distortion characteristics. As non-linear distortion characteristics of the first power amplifier 151 and the second power amplifier 152 are determined by the high-frequency signal estimator 110, the predistorter 130 corrects the nonlinear distortion of the first power amplifier 151 and the second power amplifier 152 by inversely modeling their phase and gain characteristics.

Figure 2:
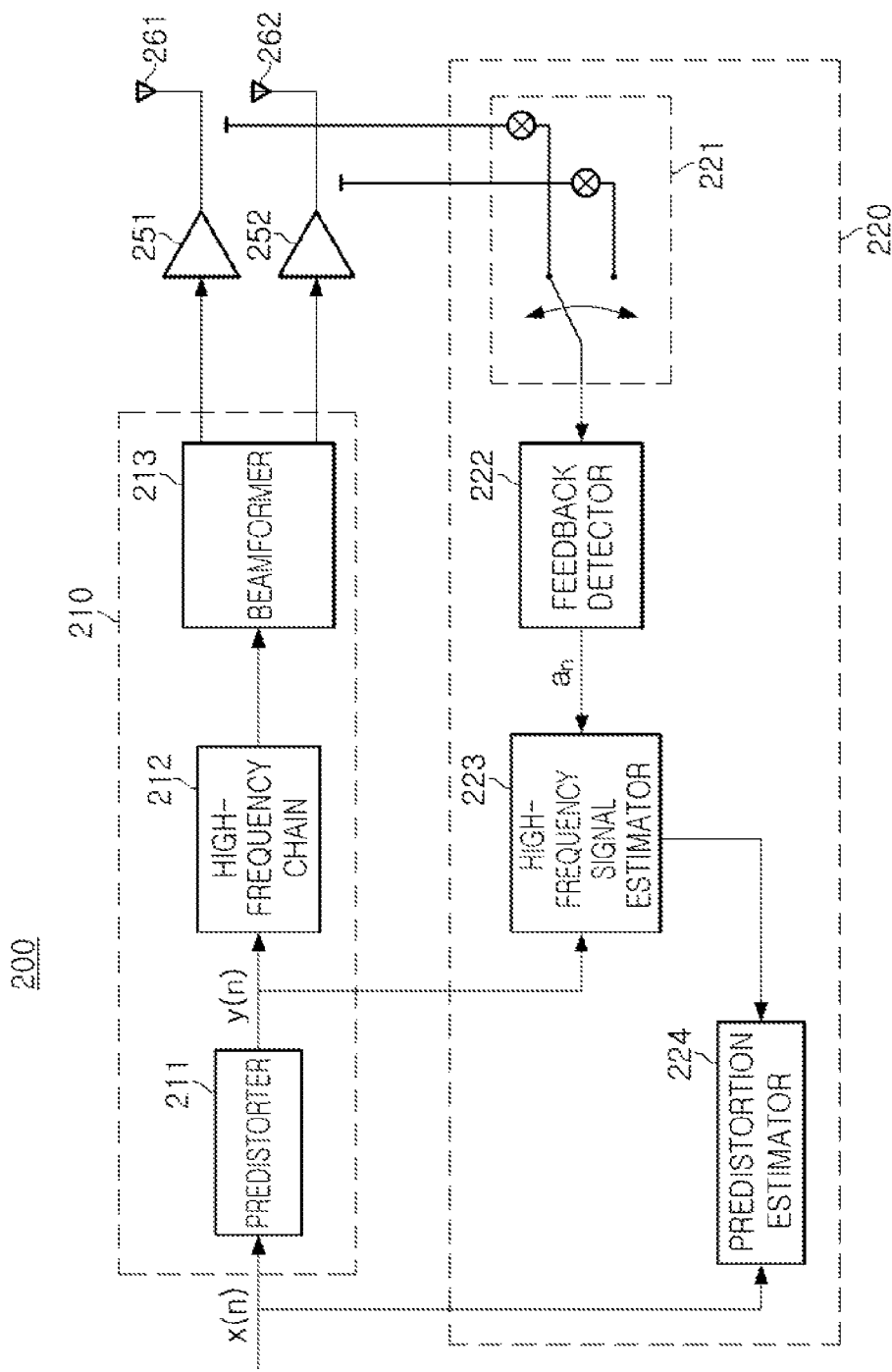
FIG. 2 is a view illustrating an example of a nonlinear distortion correcting device for power amplifier.

FIG. 2 is a view illustrating an example of a nonlinear distortion correcting device for power amplifier.

With reference to FIG. 2, a nonlinear distortion correcting device for power amplifier 200 includes a predistortion unit 210 and a feedback signal processing unit 220.

The predistortion unit 210 predistorts a base signal based on an N predistortion coefficient, converts the base signal into a plurality of high-frequency signals, and transmits the plurality of high-frequency signals to each of a first power amplifier 251 and a second power amplifier 252. The plurality of high-frequency signals amplified through the first power amplifier 251 and the second power amplifier 252 may be transmitted by a first antenna 261 and a second antenna 262, respectively.

For example, the predistortion unit 210 includes a predistorter 211, a high-frequency chain 212, and a beamformer 213. Here, the predistorter 211 may be the same as the predistorter illustrated in FIG. 1, and the beamformer 213 may be the same as the beamformer illustrated in FIG. 1.

The high-frequency chain 212 performs digital-to-analog conversion operations and frequency modulation operations with respect to the base signal.

A feedback signal processing unit 220 determines non-linear distortion characteristics of the first power amplifier 251 and the second power amplifier 252 to determine an N+1 predistortion coefficient, and may update an N predistortion coefficient to an N+1 predistortion coefficient.

For example, the feedback signal processing unit 220 may include a switch 221, a feedback detector 222, a high-frequency signal estimator 223, and a predistortion estimator 224. Here, the high-frequency signal estimator 223 may be the same as the high-frequency signal estimator illustrated in FIG. 1, and the predistortion estimator 224 may be the same as the predistortion estimator illustrated in FIG. 1.

The switch 221 is electrically connected to output terminals of the first power amplifier 251 and the second power amplifier 252, and may sequentially and repeatedly disconnect the first power amplifier 251 and the feedback detector 222, and disconnect the second power amplifier 252 and the feedback detector 222.

The feedback detector 222 converts signals output by the first power amplifier 251 and the second power amplifier 252 into a baseband signal, performs analog-to-digital conversion operations on the baseband signal, and transmits the baseband signal to the high-frequency signal estimator.

Figure 3:
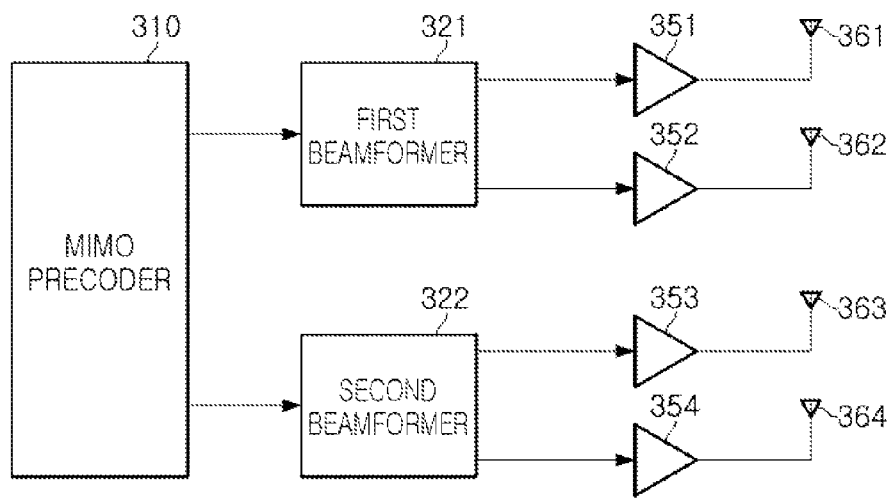
FIG. 3 is a view illustrating an example of a beamformer.

FIG. 3 is a view illustrating an example of a beamformer.

With reference to FIG. 3, a nonlinear distortion correcting device for power amplifier includes a MIMO precoder 310, a first beamformer 321, a second beamformer 322, a first power amplifier 351, a second power amplifier 352, a third power amplifier 353, a fourth power amplifier 354, a first antenna 361, a second antenna 362, a third antenna 363, and a fourth antenna 364.

The MIMO precoder 310 generates a base signal in a multiple-input multiple-output (MIMO) scheme. The base signal is processed by the predistorter and the high-frequency chain illustrated in FIG. 2.

The first beamformer 321 shifts a phase of the base signal processed based on a beamforming vector, and transmits the base signal to the first power amplifier 351 and the second power amplifier 352. The signal amplified by the first power amplifier 351 and the second power amplifier 352 are transmitted by the first antenna 361 and the second antenna 362, respectively. The first beamformer 321 may form a first subarray structure with the first power amplifier 351, the second power amplifier 352, the first antenna 361, and the second antenna 362.

The second beamformer 322 shifts a phase of the base signal processed based on a beamforming vector, and transmits the base signal to the third power amplifier 353 and the fourth power amplifier 354. The signal amplified by the third power amplifier 353 and the fourth power amplifier 354 are transmitted by the third antenna 363 and the fourth antenna 364, respectively. The second beamformer 322 may form a second subarray structure with the third power amplifier 353, the fourth power amplifier 354, the third antenna 363, and the fourth antenna 364.

A hybrid MIMO scheme may be implemented by complementary operations of the first subarray structure and the second subarray structure.

Hereinafter, experimental results with respect to a high-frequency signal predistortion device having the first subarray structure and the second subarray structure will be described with reference to FIGS. 4, 5A, 5B, 5C, and 5D.

Figure 4:
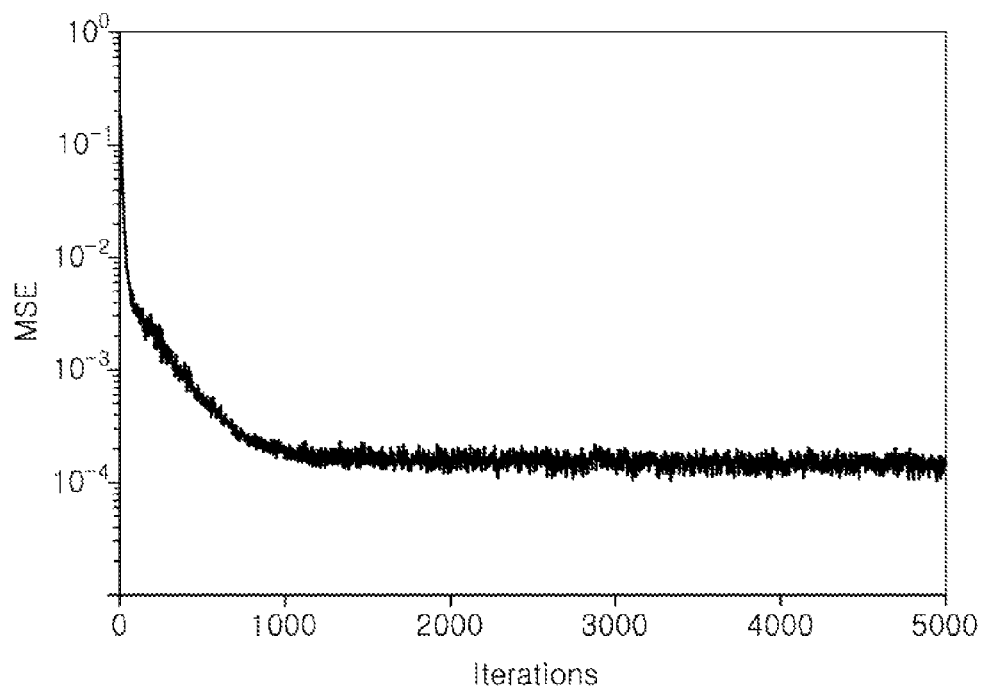
FIG. 4 is an example of a learning curve of a mean square error (MSE) of a high-frequency signal predistortion device.

FIG. 4 is an example of a learning curve of a mean square error (MSE) of a high-frequency signal predistortion device.

With reference to FIG. 4, the horizontal axis represents the number of iteration updates for a predistortion coefficient, and the vertical axis represents a mean square error. A transmission signal is assumed to be modulated into 16-QAM (Quadrature Amplitude Modulation). A pulse shaping filter is assumed to be modulated into a square root raised cosine filter in which an oversampled roll-off value is 0.25. The power amplifier model used to derive a graph of FIG. 4 is Equation 12.

$$\varphi(y(n)) = \frac{1.1\alpha y(n)}{1 + 0.3|y(n)|^2} \exp\left(j\frac{0.8\beta |y(n)|^2}{1 + 3|y(n)|^2}\right)$$ [Equation 12]

Four amplifier model coefficients are assumed to have a value of $\alpha = \beta \in \{1, 1.02, 1.04, 1.06\}$. Each of a first power amplifier, a second power amplifier, a third power amplifier, and a fourth power amplifier is assumed to have a value of 1, 1.02, 1.04, and 1.06, respectively. All of a power amplifier output identification model and a predistortion model are assumed to use a seven-degree polynomial expression. A step size $\mu$ of an adaptive algorithm for predistortion is assumed to be 0.6. A beamforming coefficient, $g_j$ is assumed to be changed for each of 1000 symbols.

In FIG. 4, a mean square error is converged after updating a predistortion coefficient about 1000 times, and the mean square error has a value of 10 to the power of −4 after convergence.

FIGS. 5A to 5D are views illustrating examples of output spectrums of respective first, second, third, and fourth power amplifiers with and without digital predistortion (DPD).

With reference to FIGS. 5A to 5D, the horizontal axis represents a value obtained by frequency normalization, and the vertical axis represents power spectral density. In addition, curve (a) represents a base signal, curve (b) represents output of a power amplifier (PA) when DPD is not performed, curve (c) represents output of a power amplifier (PA) to which DPD proposed in the subject application is applied, curve (d) represents output of a power amplifier (PA1) to which PA1-centric DPD is applied, and curve (e) represents output of a power amplifier (PA3) to which PA3-centric DPD is applied.

Here, the PA1-centric DPD is a method of performing predistortion by determining a predistortion coefficient only using output of a first power amplifier, a second power amplifier, a third power amplifier, and a fourth power amplifier. The PA1-centric DPD may be implemented as a method of applying 1 to the number of a power amplifier in predistortion proposed in an embodiment.

In FIGS. 5A to 5D, depict examples of power of a power amplifier according to predistortion proposed in the examples in comparison with the prior art. The power spectral density centers on a normalized frequency of 0, which means that linearity of the power amplifier is high. Thus, a high-frequency signal predistortion device may improve a predistortion performance.

Figure 5A:
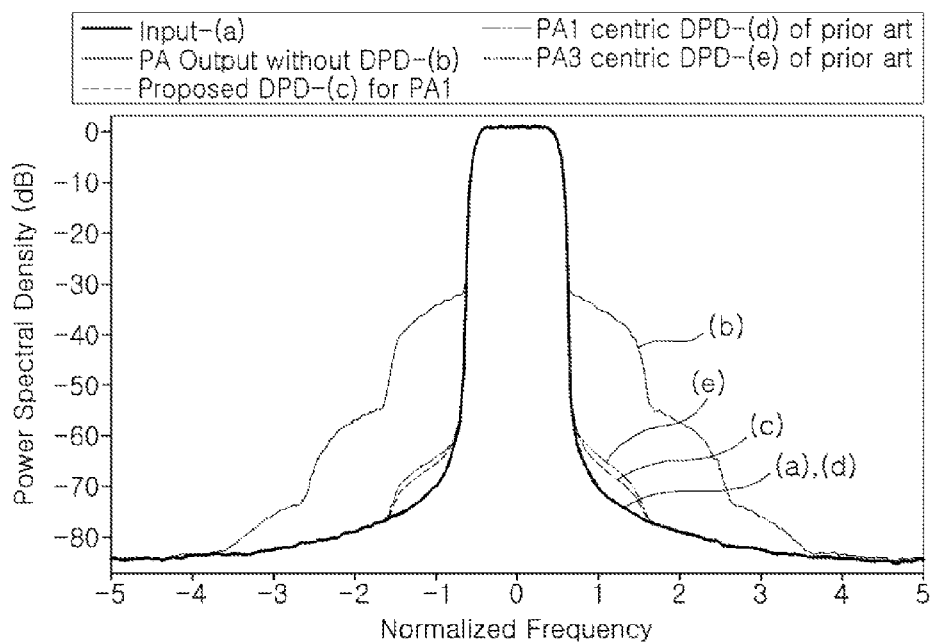
FIGS. 5A to 5D are views illustrating examples of output spectrums for the first, second, third, and fourth power amplifiers, respectively.
Figure 5B:
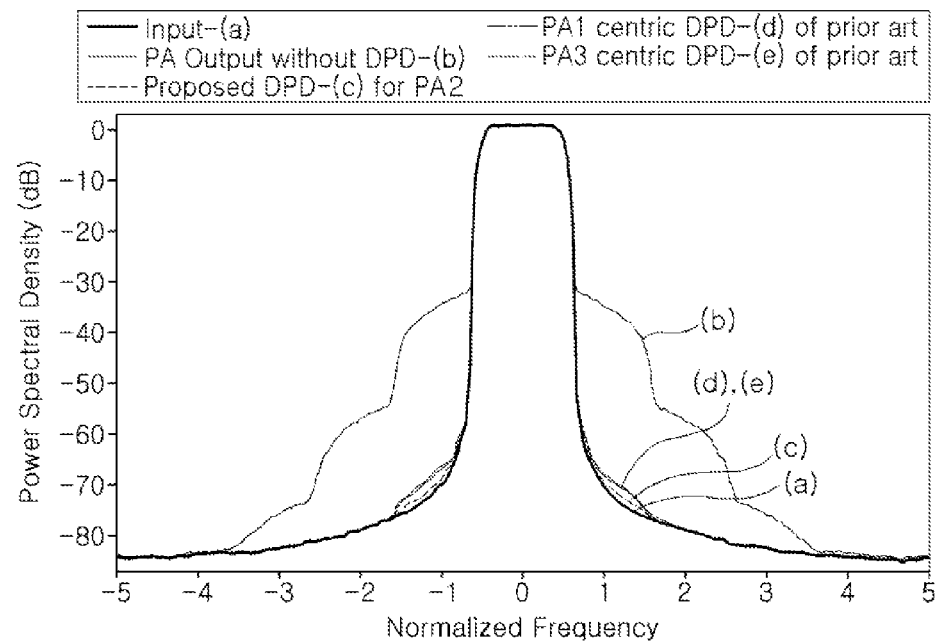
Figure 5C:
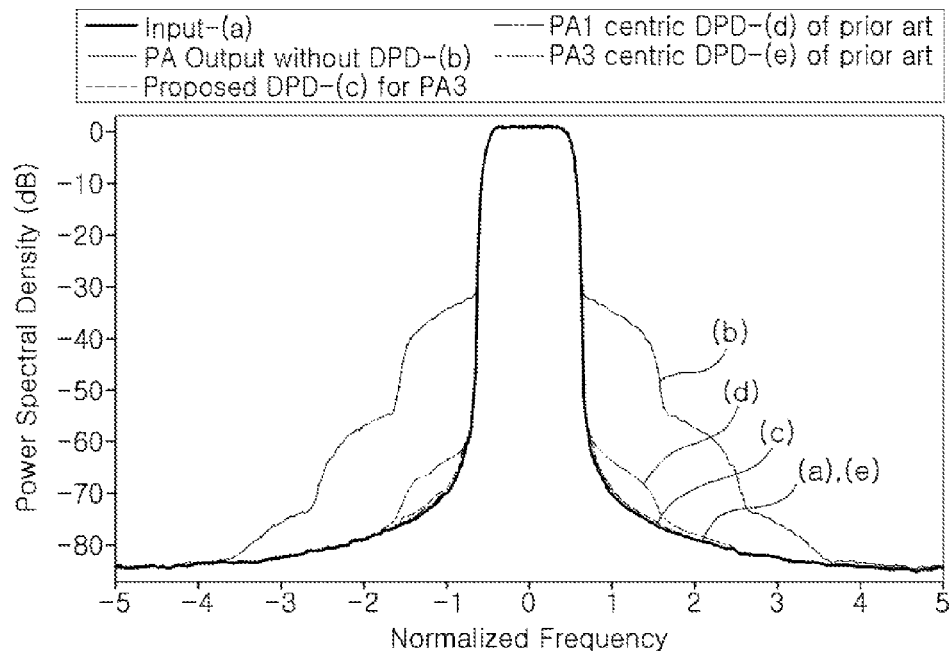
Figure 5D:
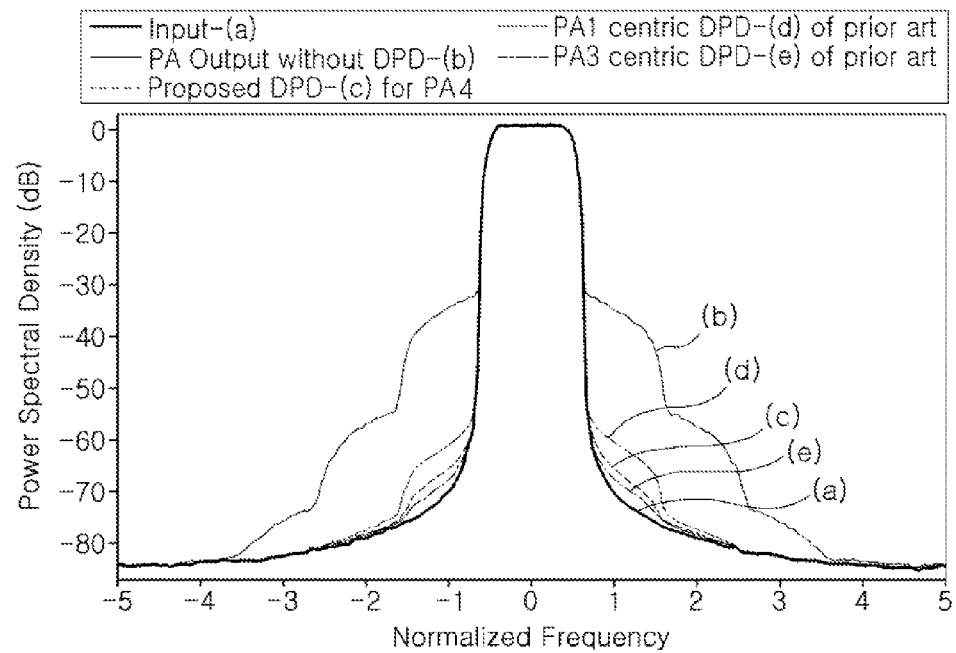

In FIG. 5A, the proposed DPD for PA1 is compared to the PA1-centric DPD of the prior art and the PA3-centric DPD of the prior art; in FIG. 5B, the proposed DPD for PA2 is compared to the PA1-centric DPD of the prior art and the PA3-centric DPD of the prior art; in FIG. 5C, the proposed DPD for PA3 is compared to the PA1-centric DPD of the prior art and the PA3-centric DPD of the prior art; and in FIG. 5D, the proposed DPD for PA4 is compared to the PA1-centric DPD of the prior art and the PA3-centric DPD of the prior art.

In FIG. 5C, according to the PA3-centric DPD, linearity of the third power amplifier is confirmed to be higher than linearity of other power amplifiers.

In addition, residual spectral regrowth (RSR) at a point in which a normalized frequency is 1 in FIGS. 5A to 5D, is described in Table 1.

TABLE 1

|  | PA1-centric method of prior art | PA3-centric method of prior art | Disclosed method |
|---|---|---|---|
| RSR of a first power amplifier (PA1) | 0.31 dB | 5.64 dB | 4.25 dB |

TABLE 1-continued

|  | PA1-centric method of prior art | PA3-centric method of prior art | Disclosed method |
|---|---|---|---|
| RSR of a second power amplifier (PA2) | 2.80 dB | 2.55 dB | 1.03 dB |
| RSR of a third power amplifier (PA3) | 6.23 dB | 0.32 dB | 0.88 dB |
| RSR of a fourth power amplifier (PA4) | 9.63 dB | 2.77 dB | 4.54 dB |

In Table 1, when the PA1-centric predistortion is applied to the fourth power amplifier, RSR is confirmed to be the highest. In this regard, because the first power amplifier has the smallest α value (α=1) and the fourth power amplifier has the largest α value (α=1.06), a difference in characteristics between the first power amplifier and the fourth power amplifier is greatest.

As described in a proposed method of Table 1, RSRs of the second power amplifier and the third power amplifier in which a has a middle value, may be similar to each other, and RSRs of the first power amplifier in which a has a minimum value and the fourth power amplifier in which a has a maximum value, may be similar to each other.

When RSRs of the PA1-centric method and the PA3-centric method are compared to each other, RSR of the PA3-centric method may be lower than RSR of the PA1-centric method on average. In other words, the PA3-centric method may have better performance than the PA1-centric method, since a α value (α=1.04) of the third power amplifier does not have a minimum value (α=1) or a maximum value (α=1.06) of a values of the four amplifiers. Thus, when a PAi-centric method is used, performance thereof may be differently obtained according to selection of 'i'.

However, as predistortion proposed in an embodiment allows a sum of square errors to be significantly reduced, performance thereof may be similar to performance of predistortion corresponding to an average value of a.

As set forth above, according to the example, predistortion with respect to a plurality of high-frequency signals or a plurality of power amplifiers may be implemented.

In addition, according to the example, predistortion may be implemented in a multiple-input multiple-output (MIMO) scheme allowing implementation costs to be reduced. Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A frequency signal predistortion device, comprising:
   a frequency signal estimator configured to sequentially determine non-linear distortion characteristics of frequency signals transmitted by antennas in a multiple-input multiple-output (MIMO) scheme;
   a predistortion estimator coupled to the frequency signal estimator, the predistortion estimator configured to determine a predistortion coefficient based on the non-linear distortion characteristics; and
   a predistorter coupled to the predistortion estimator, the predistorter configured to distort a base signal of the frequency signals based on the predistortion coefficient,
   wherein the frequency signal estimator comprises training sequence blocks configured to:
   determine the non-linear distortion characteristics using a least squares method, sequentially receive the frequency signals through a single input path to be applied to the training sequence blocks in a time sharing method, determine a cost function of a least squares method with respect to each of the training sequence blocks, and determine a least-squares determined coefficient reducing the cost function of the least squares method.

2. The frequency signal predistortion device of claim 1, further comprising:

power amplifiers configured to amplify and output the frequency signals, wherein the frequency signal estimator determines non-linear distortion characteristics of the power amplifiers.

3. The frequency signal predistortion device of claim 2, further comprising:

a frequency chain coupled between the predistorter and the power amplifiers, the frequency chain performing digital-to-analog conversion operations and frequency modulation operations on the base signal; and a feedback detector converting signals output by the power amplifiers into a baseband signal, performing analog-to-digital conversion operations on the baseband signal, and transmitting the baseband signal to the frequency signal estimator.

4. The frequency signal predistortion device of claim 1, further comprising:

a beamformer configured to shift a phase of the base signal predistorted by the predistorter based on a beamforming vector.

5. The frequency signal predistortion device of claim 4, wherein the predistortion coefficient is a value for reducing a difference between a value obtained by multiplying power of the base signal by the beamforming vector, and a value based on the non-linear distortion characteristics.

6. The frequency signal predistortion device of claim 1, wherein the predistortion estimator determines the predistortion coefficient on the basis of a gradient vector based on the non-linear distortion characteristics and a correlation matrix based on power of the base signal.

7. A frequency signal predistortion device, comprising:

a frequency signal estimator configured to sequentially determine non-linear distortion characteristics of frequency signals transmitted by antennas in a multiple-input multiple-output (MIMO) scheme;

a predistortion estimator coupled to the frequency signal estimator, the predistortion estimator configured to determine a predistortion coefficient based on the non-linear distortion characteristics; and a predistorter coupled to the predistortion estimator, the predistorter configured to distort a base signal of the frequency signals based on the predistortion coefficient, wherein the predistortion estimator determines the predistortion coefficient on the basis of a gradient vector based on the non-linear distortion characteristics and a correlation matrix based on power of the base signal, and wherein the predistortion estimator updates a value obtained by subtracting a value based on multiplication of the gradient vector and the correlation matrix, from an N predistortion coefficient used for predistortion in an N step, by predistortion in an N+1 step, where N is a natural number.

8. A nonlinear distortion correcting device for power amplifier, comprising:

a predistortion processor configured to distort a base signal based on an N predistortion coefficient, convert the base signal into frequency signals, and transmit the frequency signals to power amplifiers in a multiple-input multiple-output (MIMO) scheme, respectively; and a feedback signal processor configured to determine non-linear distortion characteristics of the power amplifiers, determine N+1 predistortion coefficient, and update the N predistortion coefficient to the N+1 predistortion coefficient, where N is a natural number, wherein the power amplifiers are provided as a first power amplifier, a second power amplifier, a third power amplifier, and a fourth power amplifier, and wherein the predistortion processor includes:

a multiple-input multiple-output (MIMO) precoder generating the base signal using the MIMO scheme;

a predistorter predistorting the base signal based on an N predistortion coefficient;

a first beamformer shifting a phase of a signal predistorted by the predistorter based on a beamforming vector to transmit the signal to the first power amplifier and the second power amplifier; and a second beamformer shifting a phase of a signal predistorted by the predistorter based on a beamforming vector to transmit the signal to the third power amplifier and the fourth power amplifier.

* * * * *